United States Patent

Fukase

[11] Patent Number: 5,773,342
[45] Date of Patent: Jun. 30, 1998

[54] METHOD FOR FORMING A STORAGE NODE IN A SEMICONDUCTOR MEMORY USING ION IMPLANTATION TO FORM A SMOOTH AMORPHOUS POLYCRYSTALLINE FILM

[75] Inventor: Tadashi Fukase, Tokyo, Japan

[73] Assignee: NEC Corporation, Tokyo, Japan

[21] Appl. No.: 856,801

[22] Filed: May 15, 1997

[30] Foreign Application Priority Data

May 16, 1996 [JP] Japan .................................. 8-121847

[51] Int. Cl.⁶ .............................................. H01L 21/8242
[52] U.S. Cl. .......................................... 438/255; 438/398
[58] Field of Search .................................. 438/255, 398, 438/964

[56] References Cited

U.S. PATENT DOCUMENTS 5,429,972  7/1995  Anjum et al. ............................ 438/398
5,656,529  8/1997  Fukase ..................................... 438/398
5,658,381  8/1997  Thakur et al. ........................... 438/398

Primary Examiner—Jey Tsai
Attorney, Agent, or Firm—Whitham, Curtis & Whitham

[57] ABSTRACT

In a semiconductor memory, for forming a storage node of an information storage capacitor formed above a semiconductor substrate, an interlayer insulator film is formed above the semiconductor substrate, and a contact hole is formed to penetrate through the interlayer insulator film and to reach the semiconductor substrate. A polysilicon film is deposited to fill the contact hole and to cover the interlayer insulator film, and ions are implanted into the polysilicon film to convert a surface layer of the polysilicon film into an amorphous state, so that the surface of polysilicon film is smoothened. On the polysilicon film, a resist mask for patterning of the storage node is formed by a photolithography, and, and the polysilicon film is etched using the resist mask to form the storage node.

20 Claims, 10 Drawing Sheets

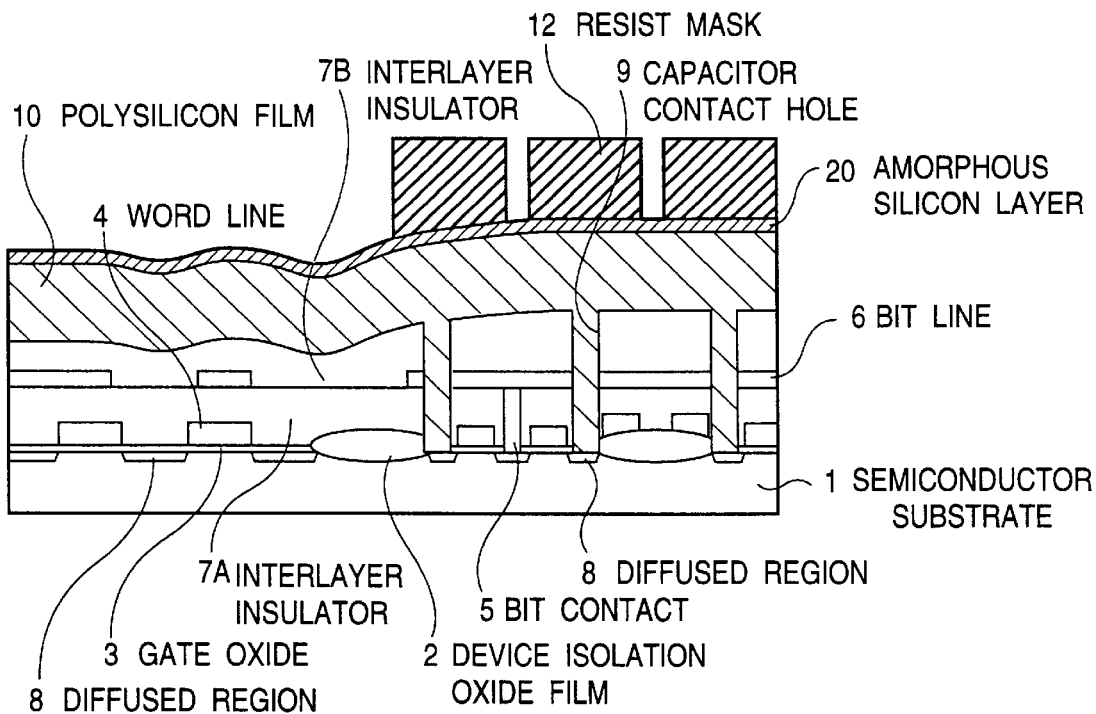
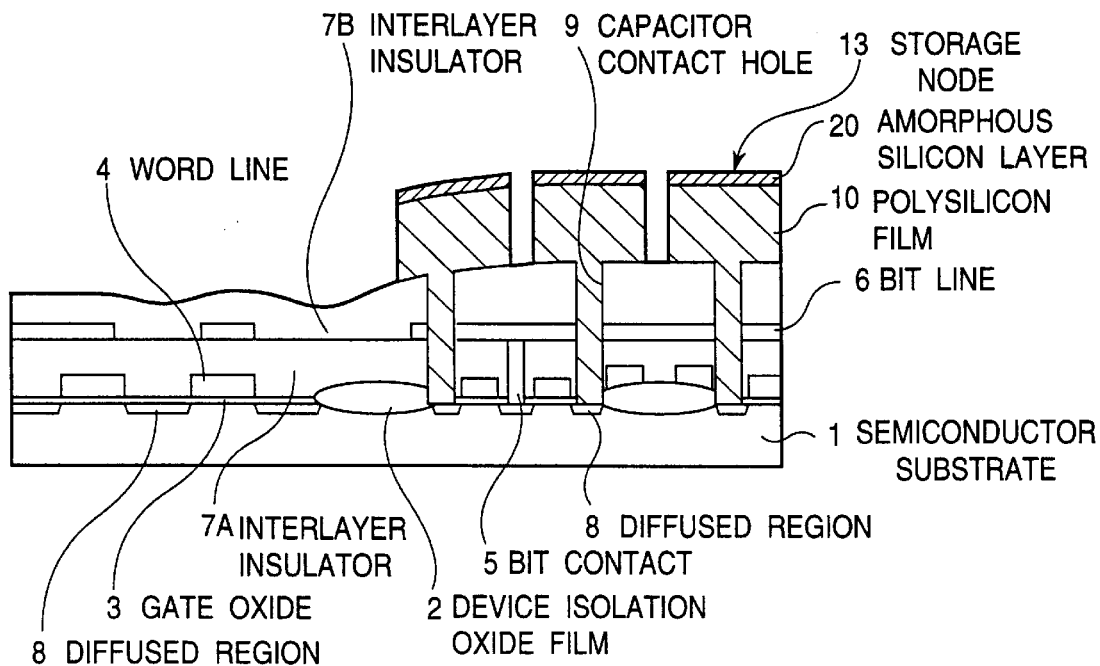

METHOD FOR FORMING A STORAGE NODE IN A SEMICONDUCTOR MEMORY USING ION IMPLANTATION TO FORM A SMOOTH AMORPHOUS POLYCRYSTALLINE FILM

BACKGROUND OF THE INVENTION

1. Field of the Invention

The present invention relates to a method for manufacturing a semiconductor device, and more specifically to a method for forming a storage node in a semiconductor memory such as a DRAM (dynamic random access memory).

2. Description of Related Art

At present, a highly microminiaturized and integrated semiconductor device has been produced on a 0.25 μm or less rule in the semiconductor device design. In order to form this extremely fine pattern, a photolithography uses a short wavelength light such as KrF excimer laser. On the other hand, in a 256 Mbit DRAM manufactured by using the above technology, in order to obtain a large storage capacitance in a limited area, such a cell structure has been adopted that a storage capacitor is formed at a level higher than that of a bit line. This is called a COB structure ("capacitor over bit-line" structure).

Referring to FIGS. 1A to 1E, there are shown diagrammatic sectional views of a portion of a DRAM for illustrating a conventional process for forming a COB structure storage capacitor.

First, as shown in FIG. 1A, on a semiconductor substrate 1 having a plurality of impurity diffused regions (source/drain regions) 8, a device isolation oxide film 2, a gate oxide film 3, a word line (gate electrode) 4, a first interlayer insulator film 7A, a bit contact 5 formed to penetrate through the first interlayer insulator film 7A, and a bit line 6 formed on the first interlayer insulator film 7A are formed as shown, and a second interlayer insulator film 7B formed of a BPSG (borophosphosilicate glass) film is deposited. Then, a capacitor contact hole 9 is formed to penetrate through the first interlayer insulator film 7A and the second interlayer insulator film 7B and to reach each corresponding impurity diffused region 8, and a polysilicon film 10 is deposited to fill the contact hole 9 and to cover the second interlayer insulator film 7B.

Thereafter, as shown in FIG. 1B, a photoresist film 11 is deposited to cover the polysilicon film 10 by means of for example a spin coating, and as shown in FIG. 1C, the photoresist film 11 is exposed into a predetermined pattern by for example a KrF excimer laser, and then, developed to form a mask 12 for formation of a storage node.

Then, the polysilicon film 10 is etched using the patterned photoresist mask 12, so as to form a storage node 13 (which comprises an individual (lower) plate, provided for each memory cell, of a pair of mutually opposing capacitor plates of a capacitor), as shown in FIG. 1D. Furthermore, as shown in FIG. 1E, a capacitor insulator film (capacitor dielectric) 14 and a storage capacitor common plate 15 are formed on the storage node 13. Thus, a storage capacitor 16 is completed. Finally, a third interlayer insulator film 17, a contact hole 18 and an upper level wiring conductor 19 are formed in the named order. Thus, a DRAM memory cell is completed.

Here, in a high microminiaturized memory cell such as a 256 Mbit DRAM memory cell, in order to store, in a limited cell area, an electric charge of the amount required for data reading, although an occupying area in a plan view is small, it is necessary to ensure that a surface area of the storage node 13 has at least a predetermined value. For this purpose, the polysilicon film 10 forming the storage node 13 is required to be deposited to have a thickness of for example 600 nm to 1200 nm.

However, the conventional process for forming the storage node in the DRAM memory cell, involves the following problems:

If the polysilicon film 10 forming the storage node 13 is deposited to have a thickness of for example 600 nm to 1200 nm. as mentioned above, a surface of the polysilicon film 10 has concave and convex bumps which reflect the crystal grain boundary of silicon. The size of this concave-convex is as small as 10 nm to 50 nm. However, because of this small concave-convex, when the resist mask 12 as shown in FIG. 1C for the storage node is patterned, the exposure light is reflected irregularly or at random by the surface of the polysilicon film 10, with the result that the size of the formed resist mask has variation or fluctuation. This variation or fluctuation in the size of the storage node results in a serious problem in an extremely small memory cell. The reason for this is that if the storage node becomes large, an insulation failure occurs between adjacent storage capacitors, and if the storage node becomes small, the capacitor shorts.

It is considered that this problem can be overcome if the conductive layer forming the storage node is formed of an amorphous silicon having a smooth surface without concave-convex. However, the amorphous silicon has to be ordinarily deposited at an as low temperature as 400° C. to 500° C. where silicon is not crystallized, and therefore, a deposition rate is very low. Therefore, a considerable length of time is required to deposit the amorphous silicon to have a thickness of 600 nm to 1200 nm.

SUMMARY OF THE INVENTION

Accordingly, it is an object of the present invention to provide a method for forming a storage node in a semiconductor memory, which has overcome the above mentioned defect.

Another object of the present invention is to provide a method for forming a storage node in a semiconductor memory, which can minimize a variation in size of the storage node caused by an at-random reflection of the exposure light at the time of forming a resist mask for the storage node.

The above and other objects of the present invention are achieved in accordance with the present invention by a method for forming a storage node in a semiconductor memory having an information storage capacitor formed above a semiconductor substrate, the method including the steps of forming an interlayer insulator film above the semiconductor substrate, forming a contact hole to penetrate through the interlayer insulator film and to reach the semiconductor substrate, depositing a polycrystalline semiconductor film to fill the contact hole and to cover the interlayer insulator film, implanting ions into the polycrystalline semiconductor film to convert a surface layer of the polycrystalline semiconductor film into an amorphous state, forming on the polycrystalline semiconductor film a resist mask for patterning of the storage node, and etching the polycrystalline semiconductor film using the resist mask to form the storage node.

In a preferred embodiment, the polycrystalline semiconductor film can be formed of a polysilicon film. An ion species used for the ion implantation may be one or ones selected from the group consisting of silicon, argon and fluorine, or one or ones selected from the group consisting of arsenic, phosphorus and boron, which are conductive impurities.

As seen from the above, the present invention is characterized by implanting ions to the polycrystalline semiconductor film having, in an as-deposited condition, a concave-convex surface which reflects the crystalline grain boundary. A "region through which the ions pass" as the result of the ion implantation, is converted into an amorphous state, with the result that an amorphous state surface of the polycrystalline semiconductor film is smoothed. Thus, at the time of patterning the resist mask for formation of the storage node by use of the photolithography, an at-random reflection of the exposure light is minimized, with the result that the variation in the size of the resist mask is correspondingly minimized.

The above and other objects, features and advantages of the present invention will be apparent from the following description of preferred embodiments of the invention with reference to the accompanying drawings.

BRIEF DESCRIPTION OF THE DRAWINGS

FIGS. 2A to 2E are diagrammatic sectional views of a portion of a DRAM for illustrating a first embodiment of the process in accordance with the present invention for forming a COB structure storage capacitor in the semiconductor memory;

DESCRIPTION OF THE PREFERRED EMBODIMENTS

Figure 1A:
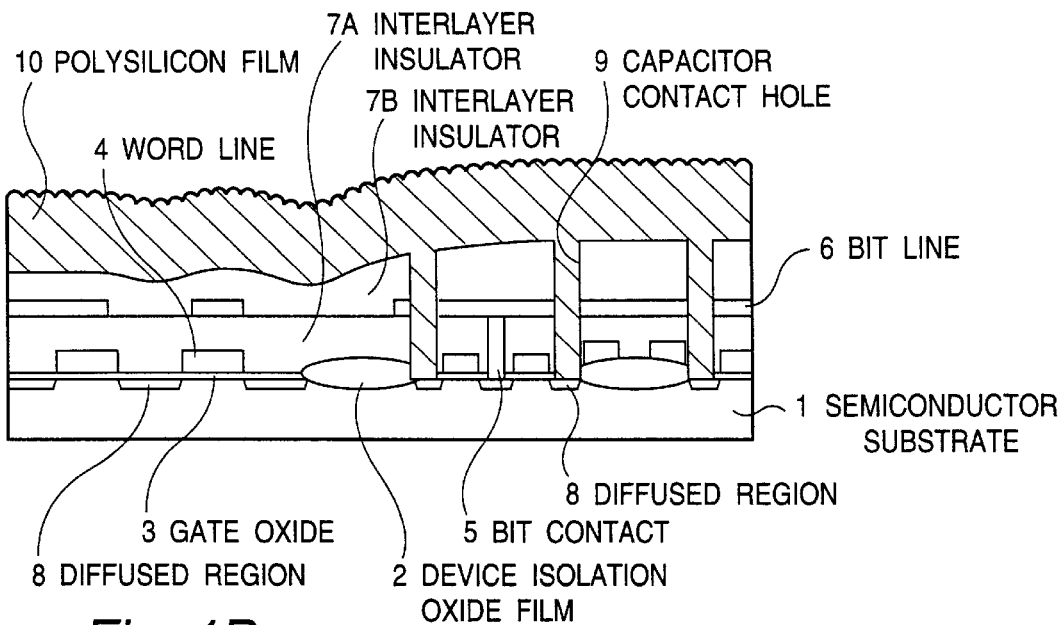
FIGS. 1A to 1E are diagrammatic sectional views of a portion of a DRAM for illustrating a conventional process for forming a COB structure storage capacitor.
Figure 1B:
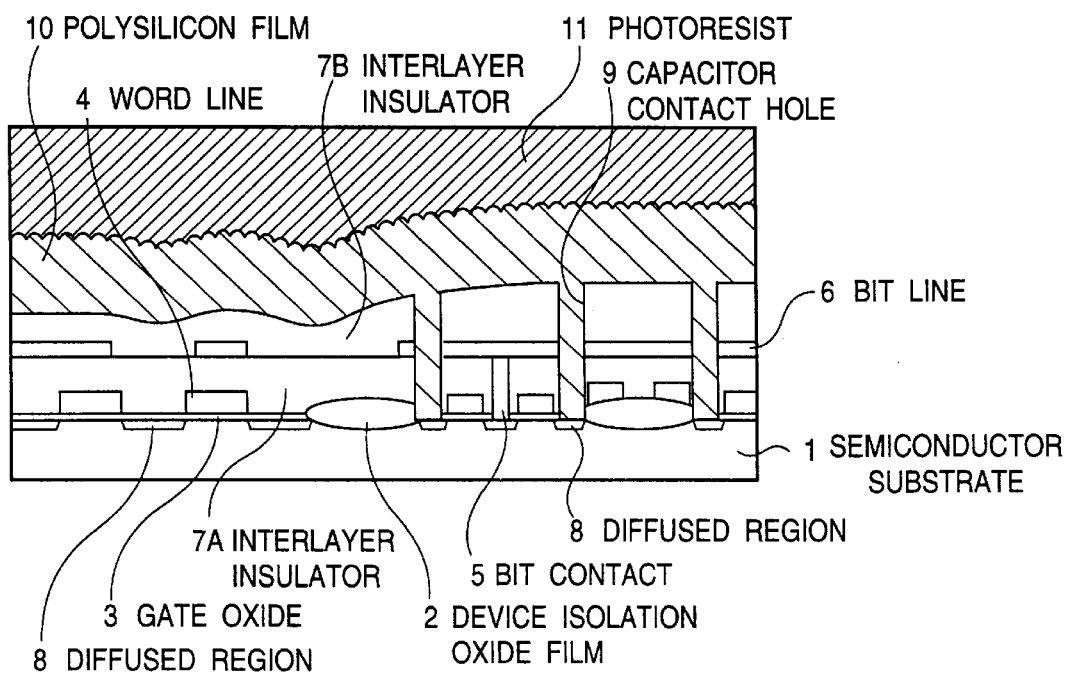
Figure 1C:
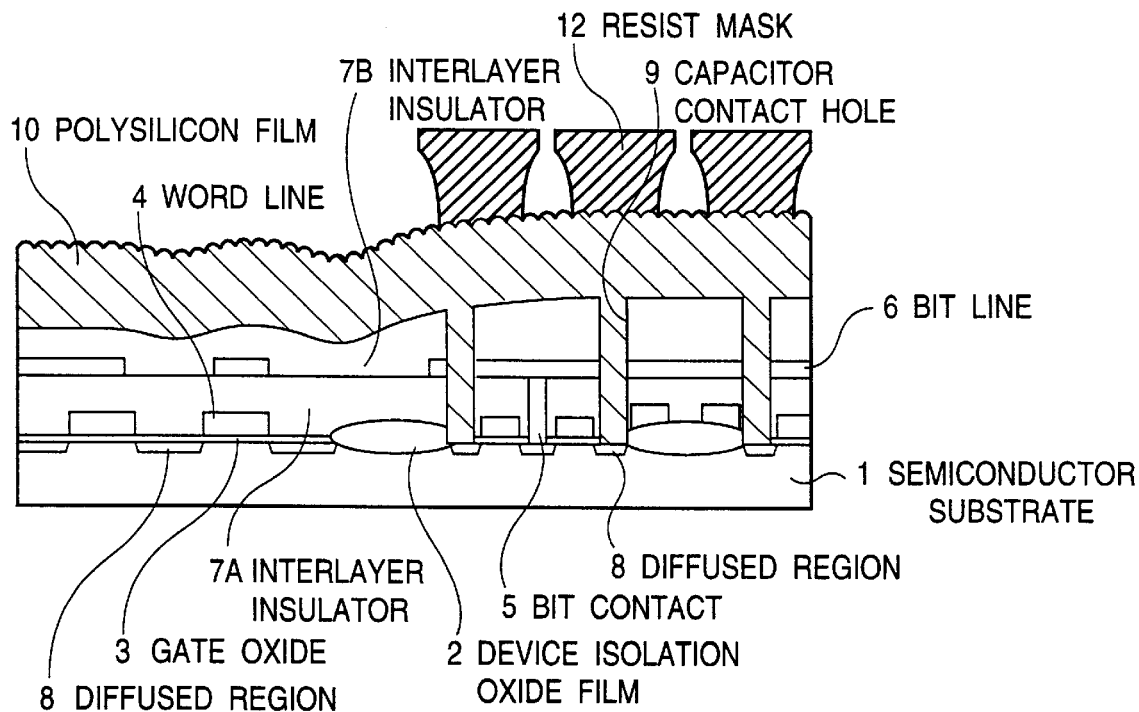
Figure 1D:
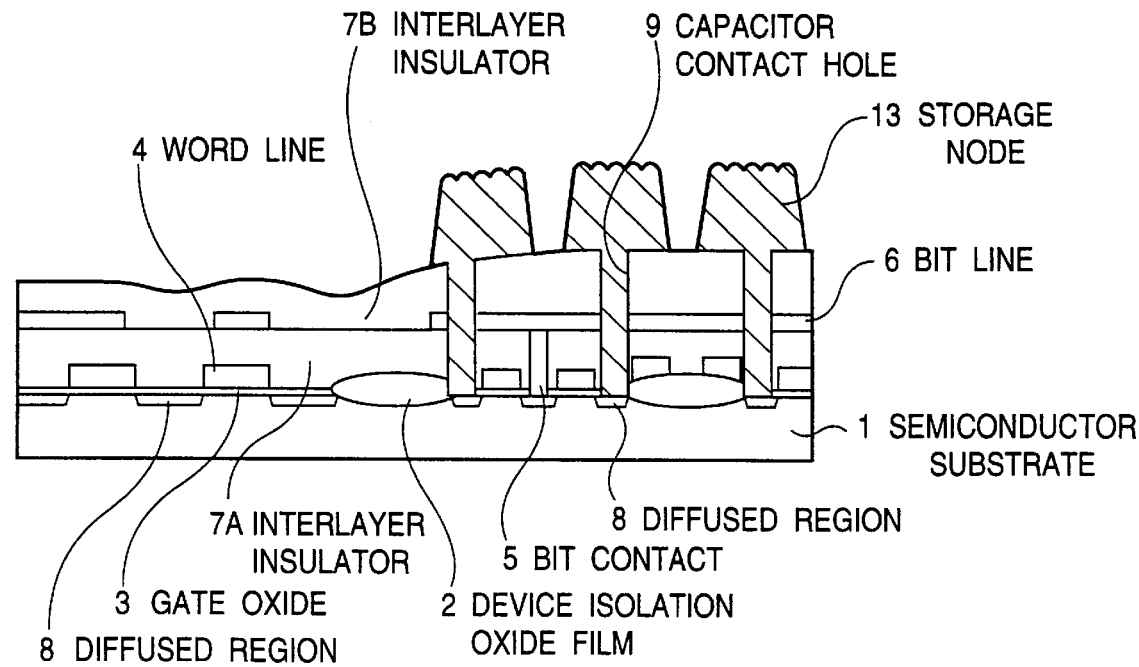
Figure 1E:
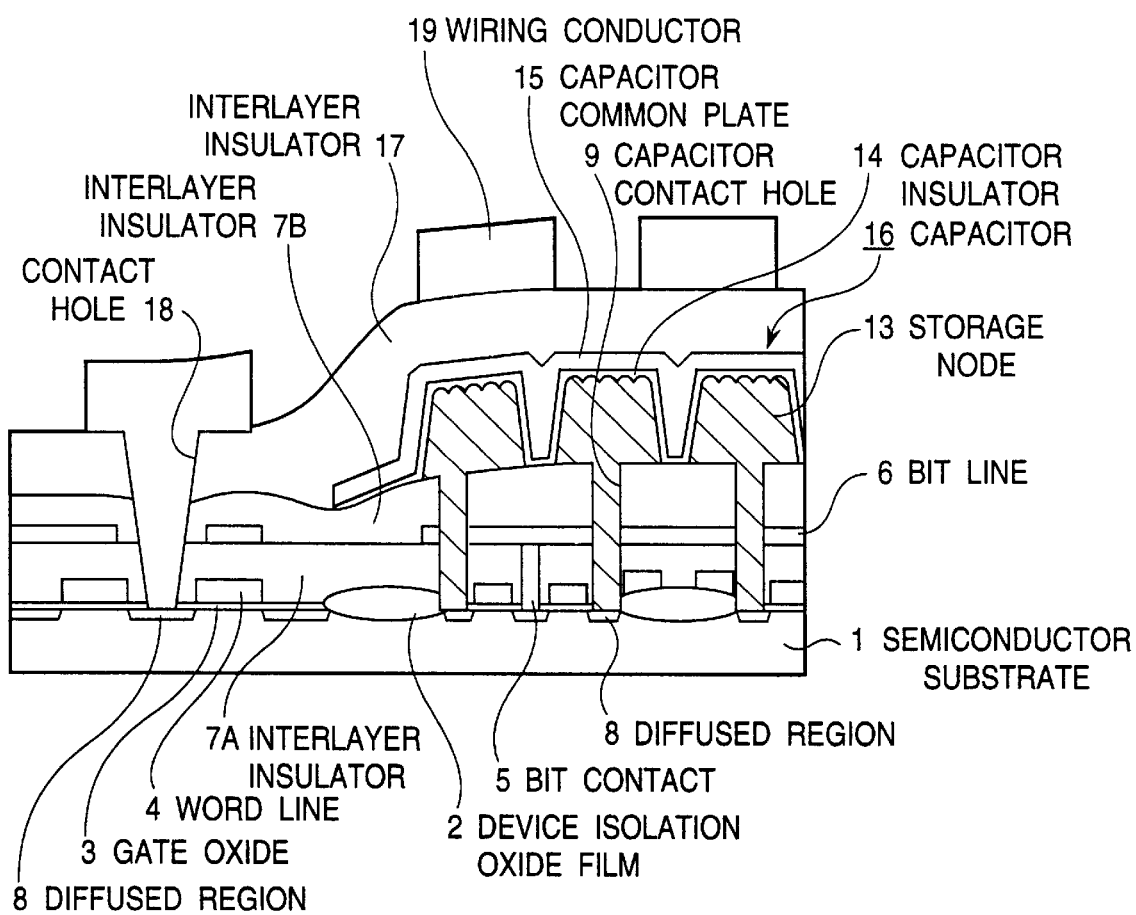

Now, a first embodiment of the process in accordance with the present invention for forming a COB structure storage capacitor in the semiconductor memory will be described with reference to FIGS. 2A to 2E, in which, elements similar to those shown in FIGS. 1A to 1E are given the same Reference Numerals. Therefore, in FIGS. 2A to 2E, Reference Numeral 1 designates a semiconductor substrate, and Reference Numeral 2 indicates a device isolation oxide film (field oxide). Reference Numeral 3 denotes a gate oxide film, and Reference Numeral 4 shows a word line (gate electrode). Reference Numeral 5 designates a bit contact, and Reference Numeral 6 indicates a bit line. Reference Numeral 7A designates a first interlayer insulator film. Reference Numeral 7B denotes a second interlayer insulator film formed of BPSG, and Reference Numeral 8 shows an impurity diffused region (source/drain region).

Figure 2A:
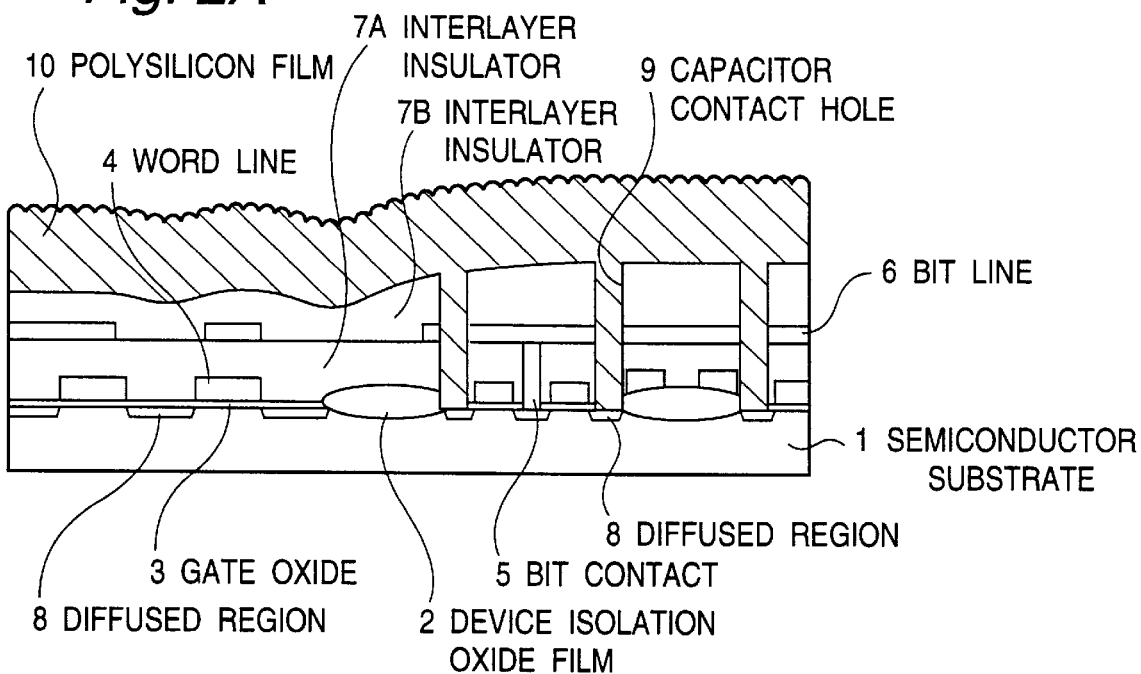

First, as shown in FIG. 2A, on the semiconductor substrate 1 having a plurality of impurity diffused regions 8, the device isolation oxide film 2, the gate oxide film 3, the word lines 4, a first interlayer insulator film 7A, a bit contact 5 formed to penetrate through the first interlayer insulator film 7A, and a bit line 6 formed on the first interlayer insulator film 7A are formed as shown, and the second interlayer insulator film 7B formed of a BPSG film is deposited. Then, capacitor contact holes 9 are formed each to penetrate through the first interlayer insulator film 7A and the second interlayer insulator film 7B and to reach a corresponding impurity diffused region 8, and a polysilicon film (polycrystalline semiconductor film) 10 is deposited to fill the contact holes 9 and to cover the second interlayer insulator film 7B. The thickness of the polysilicon film 10 is determined by the stored electric charge amount required for data reading, and is on the order of 600 nm to 1200 nm in the case of 256 Mbit DRAM. At this stage, a surface of the as-deposited polysilicon film 10 has fine concaves and convexes which reflect the crystal grain boundary of silicon.

Figure 2B:
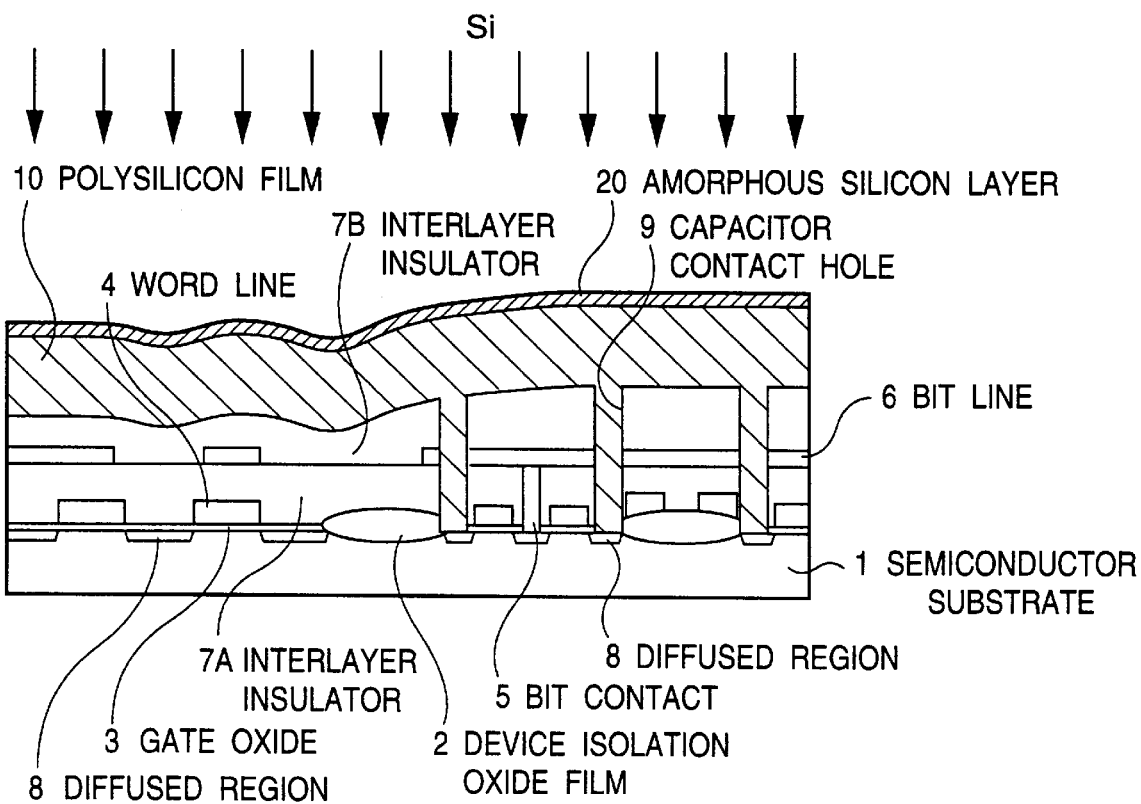

Then, as shown in FIG. 2B, silicon ions are implanted into the polysilicon film 10. An accelerating voltage and a dose for this ion implantation are determined to form an amorphous silicon layer 20 on the surface of the polysilicon film 10 as shown in FIG. 2B. In the case of implanting the silicon ions, it is preferred that the accelerating voltage is on the order of 20 keV to 70 keV, and the dose is on the order of $5.0 \times 10^{15}/cm^2$ to $2.0 \times 10^{16}/cm^2$.

Thereafter, while maintaining the surface of the polysilicon film 10 in the amorphous state, namely, without conducting a heat treatment such as an annealing, a photoresist film is deposited to cover the polysilicon film 10 by means of for example a spin coating, and as shown in FIG. 2C, the photoresist film is exposed into a predetermined pattern by for example a KrF excimer laser, and then, developed to form a plurality of masks 12 each for formation of a storage node. In this exposure process, since the surface of the amorphous silicon layer 20 is smooth, the at-random reflection of the exposure light at the surface of the amorphous silicon layer 20 is very small. Accordingly, the resist masks 12 can be formed to have a uniform size and shape.

Then, the polysilicon film 10 is etched using the patterned photoresist masks 12, so as to form a corresponding number of storage nodes 13, as shown in FIG. 2D. In this etching process, since the resist masks 12 have a uniform size and shape, the storage nodes 13 can correspondingly have a uniform size and shape. Thereafter, impurities such as phosphorus is diffused into the storage node 13 so that the storage nodes 13 have a necessary degree of conductivity.

Figure 2E:
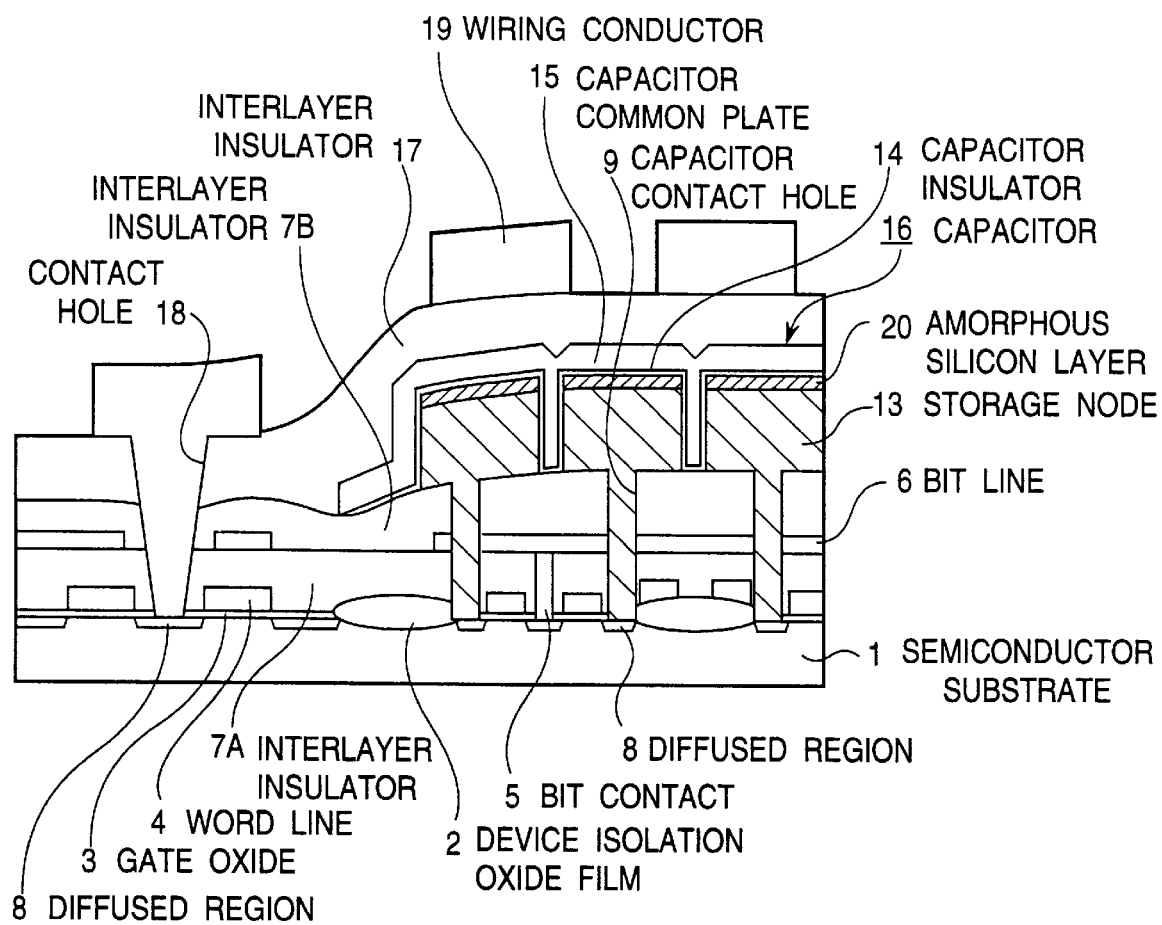

Furthermore, as shown in FIG. 2E, a capacitor insulator film (capacitor dielectric) 14 and a storage capacitor common plate 15 are formed on the storage node 13. Thus, a storage capacitor 16 is completed. Finally, a third interlayer insulator film 17, a contact hole 18 and an upper level wiring conductor 19 are formed in the named order. Thus, a DRAM memory cell is completed.

In the first embodiment, as seen from the above, the surface of the as-deposited polysilicon film 10 has fine concaves and convexes which reflect a crystal grain boundary of silicon, but, by implanting the ions into the polysilicon film 10, the amorphous silicon layer 20 is formed on the surface of the polysilicon film 10, with the result that the surface of the polysilicon film 10 is smoothed. Accordingly, at the step of forming the mask 12 each for formation of a storage node by use of the photolithography, the at-random reflection of the exposure light at the surface of the polysilicon film 10 is minimized, and therefore, variation in the size and in the shape of the resist masks 12 can be correspondingly minimized. As a result, variation in the size and in the shape of the storage capacitors 16 can be minimized. Thus, a defective attributable to the storage capacitors can be minimized, and the semiconductor memory having a minimized variation in characteristics can be produced.

In the above mentioned first embodiment, the silicon ions are implanted into the surface of the polysilicon film 10 to form the amorphous silicon layer 20. However, argon ions or fluorine ions can be used in place of the silicon ions.

A second embodiment of the process in accordance with the present invention for forming a COB structure storage capacitor in the semiconductor memory will be described with reference to FIGS. 3A to 3E, in which elements similar to those shown in FIGS. 1A to 1E and FIGS. 2A to 2E are given the same Reference Numerals. The second embodiment is characterized by using a conductive impurity as an ion implantation species for forming the amorphous silicon layer.

Figure 3A:
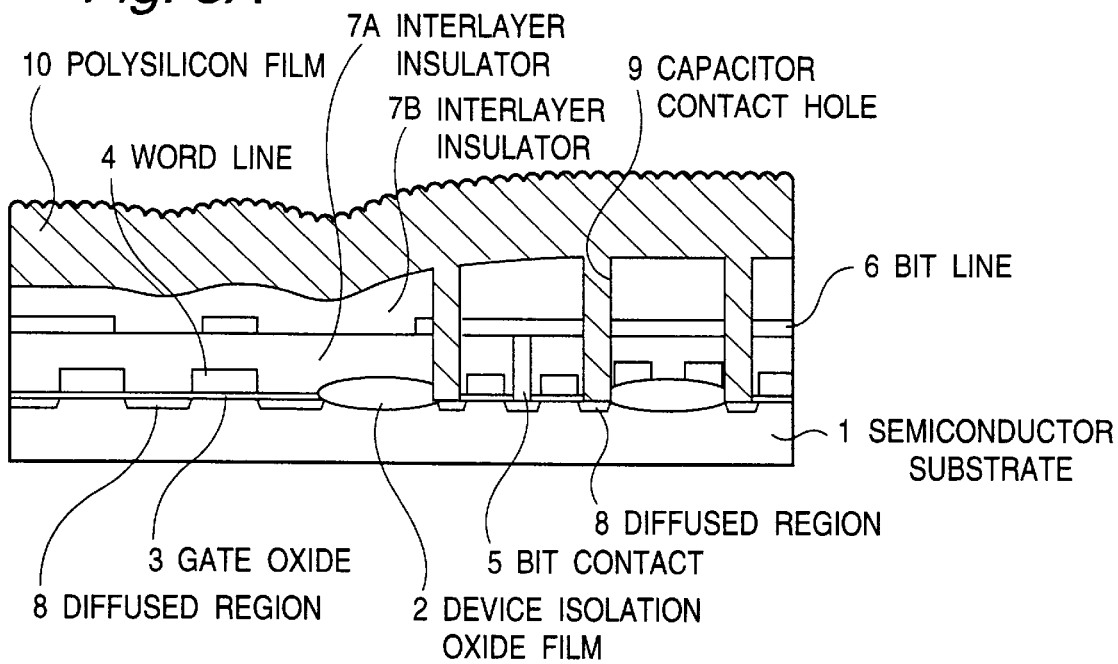
FIGS. 3A to 3E are diagrammatic sectional views of a portion of a DRAM for illustrating a second embodiment of the process in accordance with the present invention for forming a COB structure storage capacitor in the semiconductor memory.

First, as shown in FIG. 3A, on the semiconductor substrate 1 having a plurality of impurity diffused regions 8, the device isolation oxide film 2, the gate oxide film 3, the word lines 4, the first interlayer insulator film 7A, the bit contacts 5, and the bit lines 6 are formed as shown, and the second interlayer insulator film 7B formed of a BPSG film is deposited. Then, capacitor contact holes 9 are formed each to reach each corresponding impurity diffused region 8, and a polysilicon film (polycrystalline semiconductor film) 10 is deposited. The process until this condition is completely the same as a corresponding process of the first embodiment.

Figure 3B:
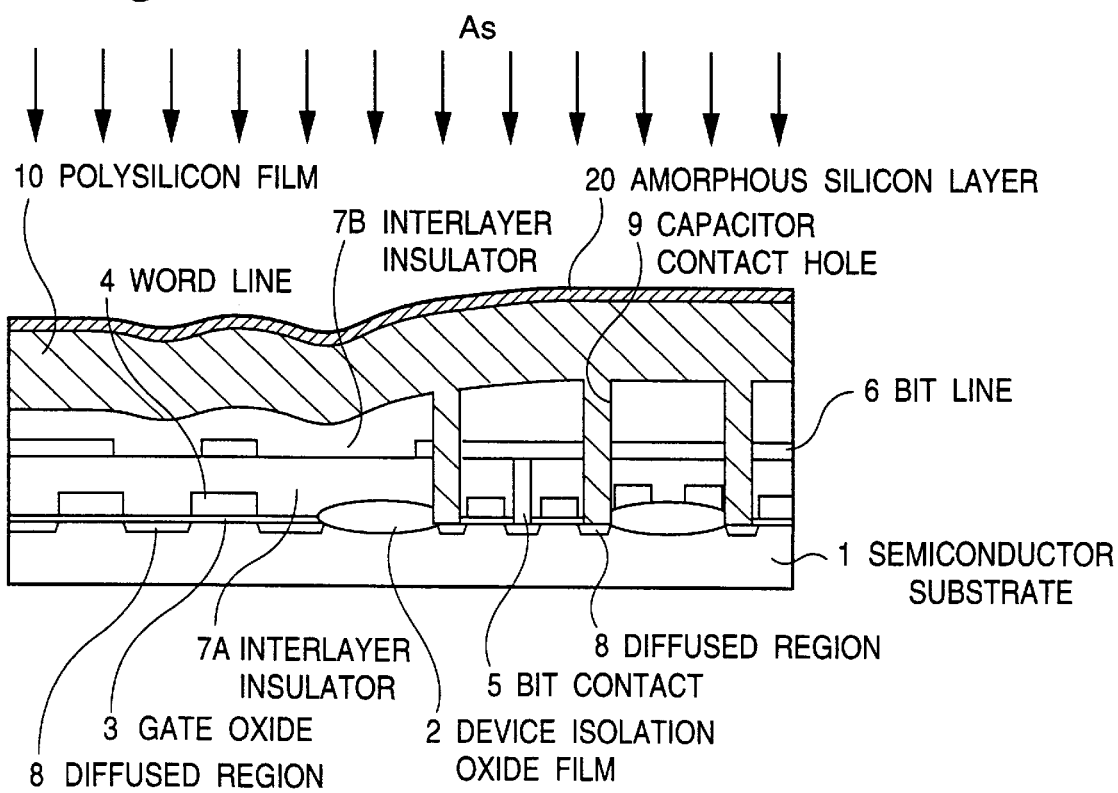

Then, as shown in FIG. 3B, conductive impurities such as arsenic ions are implanted into the polysilicon film 10. In the case of implanting the arsenic ions, the ion implantation condition is preferred to be that the accelerating voltage is on the order of 20 keV to 70 keV, and the dose is on the order of $5.0 \times 10^{15}/cm^2$ to $2.0 \times 10^{16}/cm^2$. In this process, a polysilicon film surface region through which the arsenic ions pass, is converted into an amorphous condition, so that an amorphous silicon layer 20 is formed on the surface of the polysilicon film 10 as shown in FIG. 3B. Thus, the surface of the polysilicon film 10 is smoothed. In this process, as the conductive impurities, phosphorus ions or boron ions can be used in place of the arsenic ions.

Figure 3C:
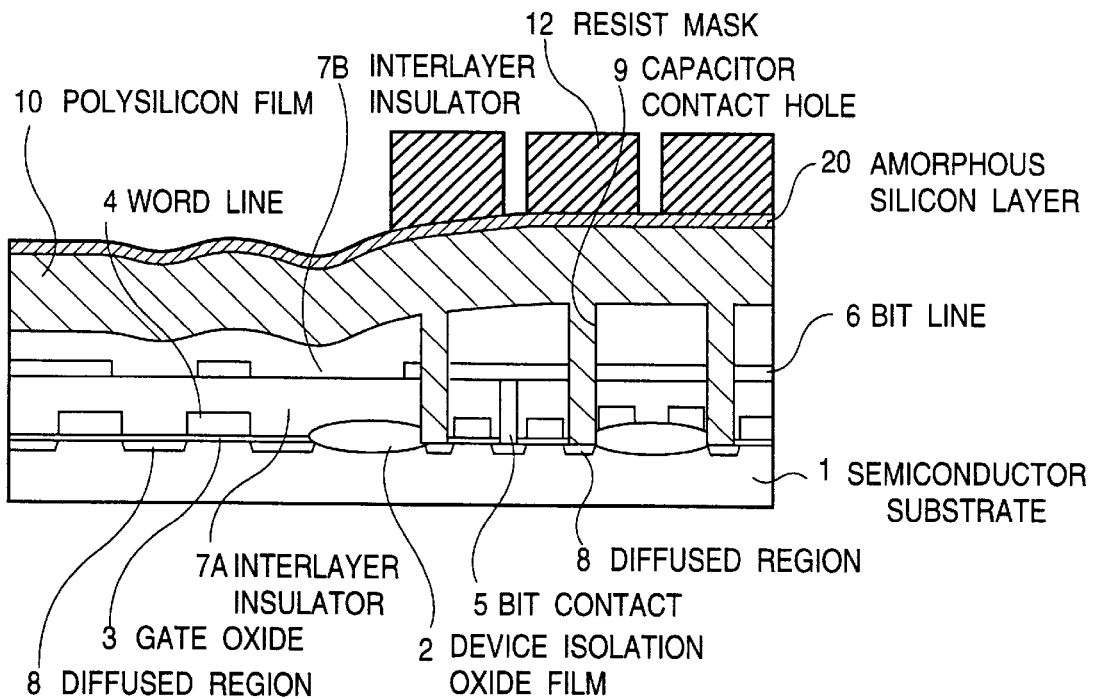

Thereafter, while maintaining the surface of the polysilicon film 10 in the amorphous state, a photoresist film is deposited to cover the polysilicon film 10, and as shown in FIG. 3C, the photoresist film is patterned by a photolithography to form the masks 12 for formation of a storage node. In this exposure process, since the surface of the amorphous silicon layer 20 is smooth, the at-random reflection of the exposure light at the surface of the amorphous silicon layer 20 at the time of forming the resist masks is very small. Accordingly, the resist masks 12 can be formed to have a uniform size and shape.

Figure 3D:
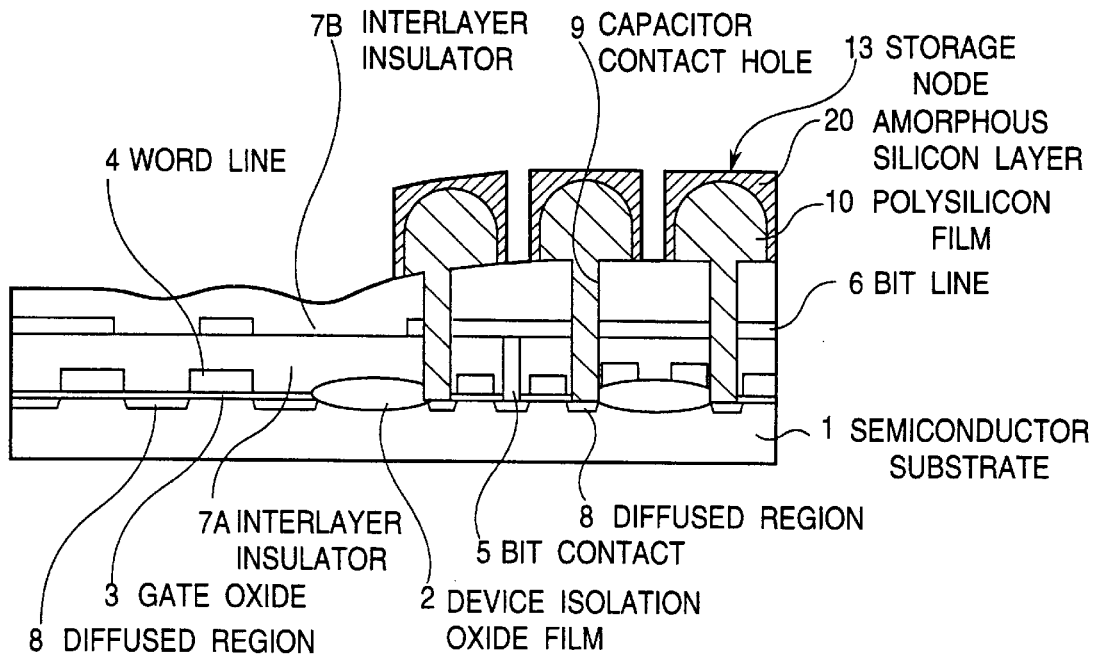

Then, the polysilicon film 10 is etched using the patterned photoresist masks 12, so as to form storage nodes 13, as shown in FIG. 3D. In this etching process, since the resist masks 12 have a uniform size and shape, the storage nodes 13 can correspondingly have a uniform size and shape. Thereafter, a heat treatment is conducted to diffuse the impurities implanted into the surface region of the storage nodes 13 with a high impurity concentration, into the whole of the storage node 13. This heat treatment can be conducted independently, or can conducted together with a heat treatment at the time of a third interlayer insulator film in a later step.

Figure 3E:
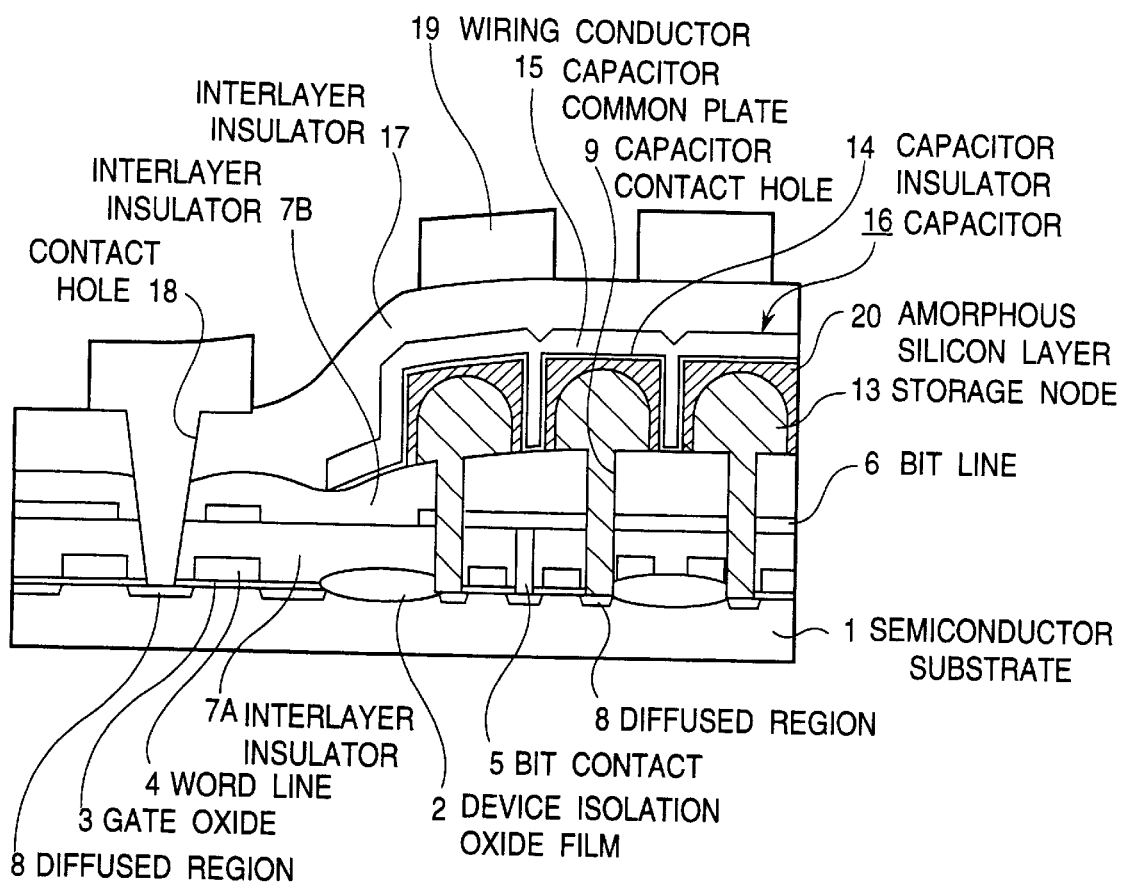

Furthermore, as shown in FIG. 3E, a capacitor insulator film (capacitor dielectric) 14 and a storage capacitor common plate 15 are formed on the storage node 13. Thus, a storage capacitor 16 is completed. Finally, a third interlayer insulator film 17, a contact hole 18 and an upper level wiring conductor 19 are formed in the named order. Thus, a DRAM memory cell is completed.

As seen from the above, also in the second embodiment, by implanting the ions into the as-deposited polysilicon film 10 having a fine concave-convex surface which reflects a crystal grain boundary of silicon, the amorphous silicon layer 20 is formed on the surface of the polysilicon film 10, with the result that the surface of the polysilicon film 10 is smoothed. Accordingly, at the step of forming the masks 12 for formation of a storage node by use of the photolithography, the at-random reflection of the exposure light at the time of forming the resist masks 12 is minimized, and therefore, variation in the size and in the shape of the resist masks 12 can be correspondingly minimized. As a result, variation in the size and in the shape of the storage capacitors 16 can be minimized. Thus, an advantage similar to that obtained in the first embodiment can be obtained in the second embodiment.

In addition, since the conductive impurity ions are implanted to convert the surface of the polysilicon film 10 into the amorphous state, and the storage nodes 13 are caused to have a necessary degree of conductivity by diffusing the conductive impurity ions, it is no longer necessary to conduct an ion implantation for causing the storage nodes 13 to have conductivity, independently of the ion implantation for formation of the amorphous layer. Therefore, the process of the second embodiment is simplified as compared with the process of the first embodiment.

Figure 4:
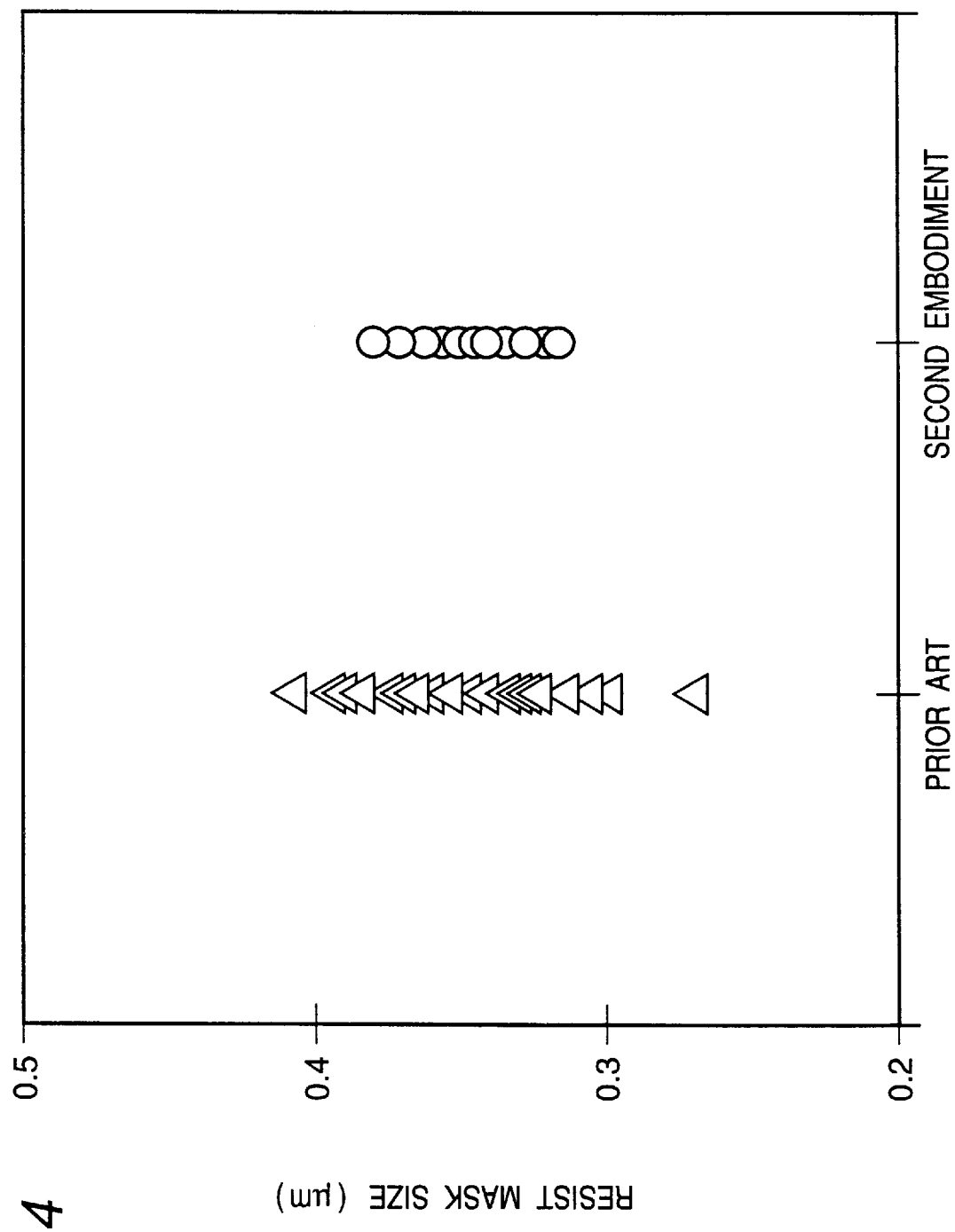
FIG. 4 is a graph illustrating the deviation of the resist mask size in the prior art and in the embodiment of the present invention.

Referring to FIG. 4, there is shown a graph illustrating the deviation of the resist mask size in the prior art and in the second embodiment of the present invention, for the purpose of evaluating the advantage of the second embodiment of the present invention.

In FIG. 4, the axis of ordinates indicates the resist mask size in the case that the mask design value is 0.35 μm. As seen from the graph of FIG. 4, in the prior art, the resist mask size varies or spreads in the range of 0.26 μm to 0.41 μm, because of the at-random reflection of the polysilicon film surface. In the second embodiment of implanting the arsenic ions into the polysilicon film surface to smoothen the polysilicon film surface, variation of the resist mask size is limited within the range of 0.31 μm to 0.38 μm. Namely, the process of the present invention is very effective in minimizing the variation of the resist mask size.

As seen from the above, the process in accordance with the present invention for forming the storage node, is characterized in that ions are implanted into the as-deposited polysilicon film (which will become the storage node) having a fine concave-convex surface which reflects the crystal grain boundary of silicon, so that the surface of the polysilicon film is converted into an amorphous state, with the result that the surface of the polysilicon film is smoothened. Accordingly, at the step of forming a resist mask for formation of a storage node by use of the photolithography, the at-random reflection of the exposure light at the surface of the polysilicon film is minimized. Therefore, variation in the size and in the shape of the storage node can be correspondingly minimized. As a result, a defective attributable to the storage capacitor can be minimized, and the semiconductor memory having a minimized variation in characteristics can be produced.

In addition, the polycrystalline semiconductor film is deposited to form the storage node, without depositing an amorphous semiconductor film which needs a considerable length of time to deposit a film having a thickness of 600 nm to 1200 nm. Thereafter, the time required for forming the storage node is greatly shorter than the case of depositing an amorphous semiconductor film for forming the storage node.

The invention has thus been shown and described with reference to the specific embodiments. However, it should be noted that the present invention is in no way limited to the details of the illustrated structures but changes and modifications may be made within the scope of the appended claims.

I claim:

1. A method for forming a storage node in a semiconductor memory having an information storage capacitor formed above a semiconductor substrate, comprising the steps of:

forming an interlayer insulator film above said semiconductor substrate;

forming a contact hole to penetrate through said interlayer insulator film and to reach said semiconductor substrate;

depositing a polycrystalline semiconductor film to fill said contact hole and to cover said interlayer insulator film;

implanting ions into said polycrystalline semiconductor film to convert a surface layer of said polycrystalline semiconductor film into an amorphous state to smooth said surface layer of said polycrystalline film;

forming on said surface layer of said polycrystalline semiconductor film a resist mask for patterning of said storage node; and etching said polycrystalline semiconductor film using said resist mask to form said storage node.

2. A method as recited in claim 1 wherein said polycrystalline semiconductor film comprises polysilicon film.

3. A method as recited in claim 2 wherein the step of implanting ions comprises ions selected from the group consisting of silicon, argon and fluorine.

4. A method as recited in claim 2 wherein the step of implanting ions comprises ions selected from the group consisting of arsenic, phosphorus and boron.

5. A method as recited in claim 1 wherein the step of implanting ions comprises ions selected from the group consisting of silicon, argon and fluorine.

6. A method as recited in claim 1 wherein the step of implanting ions comprises ions selected from the group consisting of arsenic, phosphorus and boron.

7. A method as recited in claim 3 wherein an accelerating voltage for said step of implanting ions is on the order of 20 KeV to 70 KeV.

8. A method as recited in claim 7 wherein a dose for said step of implanting ions is on the order of $5\times10^{15}/cm^2$ to $2\times10^{16}/cm^2$.

9. A method as recited in claim 4 wherein an accelerating voltage for said step of implanting ions is on the order of 20 KeV to 70 KeV.

10. A method as recited in claim 9 wherein a dose for said step of implanting ions is on the order of $5\times10^{15}/cm^2$ to $2\times10^{16}/cm^2$.

11. A method as recited in claim 2 wherein said polysilicon film comprises 600 nm to 1200 nm in thickness.

12. A method as recited in claim 1 wherein said resist mask is deposited by spin coating.

13. A method for forming a storage node in a semiconductor memory having a capacitor over bit-line (COB) configuration, comprising the steps of:

forming an interlayer insulator film on a semiconductor substrate;

forming a contact hole through said interlayer insulator film and to said semiconductor substrate;

depositing a polycrystalline semiconductor film covering said interlayer insulator film and filling said contact hole, said polycrystalline semiconductor film having a crystal grain structure defining convex and concave bumps on a surface layer thereof;

implanting ions into said polycrystalline semiconductor film to convert said surface layer of said polycrystalline semiconductor film into an amorphous state creating a smooth surface layer devoid of said convex and concave bumps; and depositing a resist mask on said smooth surface layer of said polycrystalline semiconductor film for patterning said storage node.

14. A method for forming a storage node in a semiconductor memory having a capacitor over bit-line (COB) configuration as recited in claim 13 wherein said polycrystalline semiconductor film comprises polysilicon film.

15. A method for forming a storage node in a semiconductor memory having a capacitor over bit-line (COB) configuration as recited in claim 14 wherein the step of implanting ions comprises ions selected from the group consisting of silicon, argon and fluorine.

16. A method for forming a storage node in a semiconductor memory having a capacitor over bit-line (COB) configuration as recited in claim 15 wherein an accelerating voltage for said step of implanting ions is on the order of 20 KeV to 70 KeV.

17. A method for forming a storage node in a semiconductor memory having a capacitor over bit-line (COB) configuration as recited in claim 16 wherein a dose for said step of implanting ions is on the order of $5\times10^{15}/cm^2$ to $2\times10^{16}/cm^2$.

18. A method for forming a storage node in a semiconductor memory having a capacitor over bit-line (COB) configuration as recited in claim 14 wherein the step of implanting ions comprises ions selected from the group consisting of arsenic, phosphorus and boron.

19. A method for forming a storage node in a semiconductor memory having a capacitor over bit-line (COB) configuration as recited in claim 18 wherein an accelerating voltage for said step of implanting ions is on the order of 20 KeV to 70 KeV.

20. A method for forming a storage node in a semiconductor memory having a capacitor over bit-line (COB) configuration as recited in claim 19 wherein a dose for said step of implanting ions is on the order of $5\times10^{15}/cm^2$ to $2\times10^{16}/cm^2$.

* * * * *